United States Patent [19]
Lerch et al.

[11] Patent Number: 5,935,650
[45] Date of Patent: Aug. 10, 1999

[54] METHOD OF OXIDATION OF SEMICONDUCTOR WAFERS IN A RAPID THERMAL PROCESSING (RTP) SYSTEM

[76] Inventors: Wilfried Lerch, Veilchenweg 27, D-89134 Blaustein; Georg Roters, Weselerstr. 37, D-48249 Duelman; Peter Muenzinger, Heinrichgasse 11, D-89231 Neu-Ulm; Roland Mader, Im Stiftallmey 44, D-87439 Kempten, all of Germany

[21] Appl. No.: 08/953,590

[22] Filed: Oct. 17, 1997

[51] Int. Cl.[6] .......................... C23C 16/00; H01L 21/02
[52] U.S. Cl. ..................... 427/255.4; 427/397.7; 438/773
[58] Field of Search .............. 427/255.4, 397.7; 438/773, 770

[56] References Cited

U.S. PATENT DOCUMENTS

| | | | |
|---|---|---|---|
| 4,791,071 | 12/1988 | Ang | 437/42 |
| 5,059,448 | 10/1991 | Chandra et al. | 427/53.1 |
| 5,210,056 | 5/1993 | Pong et al. | 437/239 |
| 5,498,577 | 3/1996 | Fulford, Jr. et al. | 437/228 |
| 5,612,249 | 3/1997 | Sun et al. | 437/69 |

FOREIGN PATENT DOCUMENTS 1-4025   1/1989   Japan .

*Primary Examiner*—Roy V. King
*Attorney, Agent, or Firm*—Rodney T. Hodgson

[57] ABSTRACT

A method of producing a film on the surface of a semiconductor wafer in an RTP system, comprising: a) rapidly processing the wafer at a first temperature $T_1$ in an atmosphere containing a substantial vapor pressure of a first reactive gas; then b) rapidly processing the wafer at a second temperature $T_2$ in an atmosphere substantially free of the first reactive gas is described.

13 Claims, 11 Drawing Sheets

METHOD OF OXIDATION OF SEMICONDUCTOR WAFERS IN A RAPID THERMAL PROCESSING (RTP) SYSTEM

FIELD OF THE INVENTION

The present invention relates to a method producing high quality films on the surface of an object heated in a Rapid Thermal Processing (RTP) system. More specifically, the present invention discloses a method for improving the quality of a conventionally produced layer which has been deposited or grown on the surface of the object. The present invention is particularly useful in the case of semiconductor wafers which have layers of material formed from reacting a gas with the semiconductor material, such as Rapid Thermal Oxidation (RTO) or Rapid Thermal Nitridation (RTN), and in the case where a material is deposited from a gas, such as Rapid Thermal Chemical Vapor Deposition (RT-CVD).

The present invention improves the repeatability, decreases defect density, and increases yield of the prior art RTO process.

BACKGROUND OF THE INVENTION

A wide variety of dielectric films are used in microcircuit technology today. Many of these films are deposited on the semiconductor in which the microcircuit is formed. However, others are grown out of the semiconductor itself and are referred to be native films. The principle advantage of these native films is that they are relatively free of contaminants. This is because they are grown under consumption of the pure semiconductor in hyperpure gas ambients where impurity concentrations are limited.

Native films are widely used in semiconductor manufacturing because of their ease of formation and excellent interface with the underlying substrate. In silicon the basis of all device surface passivation is the native $SiO_2$, though other insulating deposited films are useful as secondary layers in microcircuit fabrication. Furthermore, thermally grown oxides are used for masking, screen oxides, device isolation and for tunnel or gate dielectrics. This wide variety of applications led to intensive studies of the electrical properties and growth kinetics of silicon dioxide in the past years as published in detail in B. E. Deal and S. Grove J. Appl. Phys. 36 (12), 3770–3778 (1965) and P. Balk, THE SI—$SiO_2$ SYSTEM, Elsevier Science Publishing, Amsterdam, 1988.

Most of these investigations concentrated on conventional furnace oxidations in purified dry oxygen ($H_2O$ content less than 10 ppm) or in wet oxygen ambients, as detailed in the above references and in B. E. Deal, J. Electrochem. Soc. 125 (4), 576–579, (1978). With the introduction of the first rapid thermal processing systems several years ago, the first Rapid Thermal Oxidation (RTO) data in dry oxygen ambient were presented by M. M. Moslehi, S. C. Shatas and K. C. Saraswat, Appl. Phys. Let. 47 (12), 1353–1355 (1985).

For the growth of thick dry silicon dioxides too much time-temperature of the thermal budget is necessary. For example, a 1150° C. treatment for 90 sec is necessary to produce a 19.3 nanometer (nm) $SiO_2$ film on the silicon surface. These very high time-temperature combinations may cause problems concerning the electrical properties achieved prior to oxidation, so a reduction of the time-temperature combination during oxidation is indispensable.

Moslehi et al. reported in the Texas Instrument Technical Journal 9(5) 44–64, (1992) on wet oxidations performed near atmospheric pressure (650 Torr) for the initial growth of 25 nm mask oxides for CMOS well processing. M. Glueck, U. Koenig, J. Hersener, Z. Nenyei and A. Tillmann Mat. Res. Soc. Symp. Proc. 342 215–225 (1994) used a bubbler system with deionized water to run wet oxidation in a Rapid Thermal Processing (RTP) system. However, the repeatability of the bubbler method was poor because of insufficient control of the $H_2O$ partial pressure. Higher metal contamination and particle density are also associated with this method.

These serious problems have been solved by combining an RTP system with a pyrogenic steam generator which is well known from conventional furnace technology. The impurity concentration only depends on the contamination residuals in the gas. The resulting oxides are, however, of lesser quality than the oxides produced in conventional furnaces. The present invention is a method of raising the quality of the wet oxides and other native and non-native films produced in an RTP system to the maximum possible.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. U.S. Pat. No. 5,580,830, assigned to the assignee of the present invention, hereby incorporated by reference, teaches the importance of the gas flow and the use of an aperture in the door to regulate gas flow and control impurities in the process chamber.

The importance of measuring the temperature of the wafer using a pyrometer of very broad spectral response is taught in U.S. Pat. No. 5,628,564, which is assigned to the assignee of the present invention and is hereby incorporated by reference.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending patent application Ser. No. 08/537,409, filed Oct. 02, 1995, now U.S. Pat. No. 5,861,609, assigned to the assignee of the present invention, hereby incorporated by reference, teaches the importance succeptor plates separated from the wafer.

Rapid thermal processing of III–IV semiconductors has not been as successful as RTP of silicon. One reason for this is that the surface has a relatively high vapor pressure of, for example, arsenic (As) in the case of gallium arsenide (GaAs). The surface region becomes depleted of As, and the material quality suffers. Copending patent application Ser. No. 08/631,265, filed Apr. 12, 1996, now U.S. Pat. No. 5,837,555, assigned to the assignee of the present invention, hereby incorporated by reference, supplies a method and apparatus for overcoming this problem.

A method of raising the emissivity of a lightly doped, relatively low temperature wafer by locally heating the wafer with a pulse of light is disclosed in copending application Ser. No. 08/632,364, filed Apr. 10, 1996, now U.S. Pat. No. 5,727,017, which is assigned to the assignee of the present invention and hereby incorporated by reference.

SUMMARY OF THE INVENTION

According to this invention, the conventional step of producing a film on the surface of an object in an RTP system is followed by an additional step of processing the object in a different gas ambient than that used for the initial processing step. In a yet more preferred embodiment of the invention, the temperature of the object is lowered while the initial processing gas is removed from the RTP chamber. After the partial pressure of an active component of the initial processing gas has reached a certain value, the temperature of the object is then raised for the additional step of processing the object in a different gas ambient than that used for the initial processing step.

DETAILED DESCRIPTION OF THE INVENTION

Experimental Setup

All wafers for these experiments were annealed in a conventional AST SHS2800e RTP system in combination with a pyrogenic steam generator.

The rapid thermal processing system is characterized by tungsten halogen lamps below and above the wafer and four sidelamps, by an independent lamp control and by an independent top and bottom heater bank control. The power of the lamps can be limited or ramped up and ramped down in any recipe step according to the recipe design. The wafer is surrounded by a quartz reactor in a gold coated mirror chamber, which is called a photon box. Temperature is measured by a pyrometer, which detects the emission from the wafer backside at 2.7 micrometer wavelength.

Figure 1:
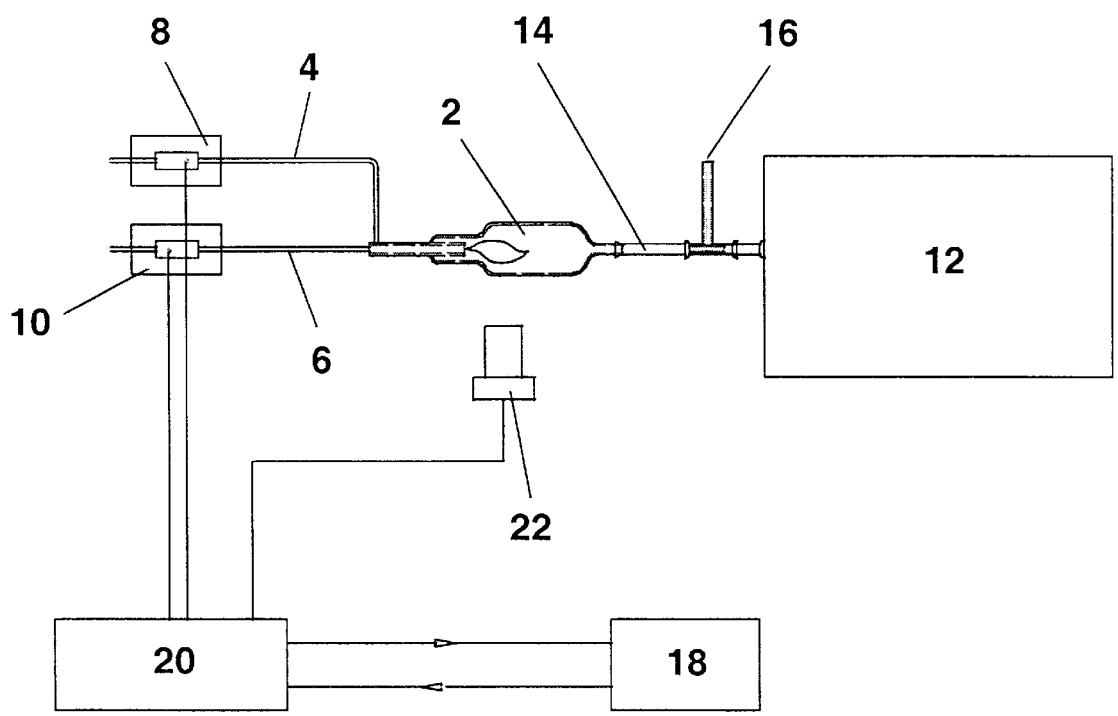
FIG. 1 Shows a schematic diagram of a pyrogenic steam generator implemented in an AST SHS2800e RTP system.

In FIG. 1 a schematic view of the pyrogenic system is shown. The quartz reaction vessel 2 is resistively heated up to 700° C. in the gas injector area. Hydrogen gas 4 and oxygen gas 6 of grade 5.0 are controlled by mass flow controllers 8 and 10. Autoignition of hydrogen and oxygen occurs in the reaction vessel 2 at temperatures above 650° C. The mixture of the gases is controlled by the two mass flow controllers 8 and 10 and is limited to a maximum $H_2:O_2$-ratio of two. Safety considerations lead to a non-stoichiometric hydrogen-to-oxygen ratio of 1.67 so that a maximum concentration of 91% $H_2O$ steam with 9% excess oxygen can be set in the total gas flow.

The quartz reaction vessel 2 is directly connected to the quartz RTP reactor 12 by a quartz connector 14 without any metal contacts. The short distance between the reaction vessel 2 and the RTP reactor 12 guarantees that no condensation occurs. In between the reaction vessel 2 and the and RTP reactor 12, the standard process gas system 16 is connected to the quartz connector 14. The control of the whole system is done by the SHS controller 18. The pyrogenic controller 20 works as slave of the SHS controller 18 and the $H_2O$ steam can be used as a normal gas line with setpoint and readout. This guarantees easy usage. All safety features such as flame sensor 22, $H_2$ sensor and $O_2$ pressure controller (not shown) are implemented in the system.

Figure 2:
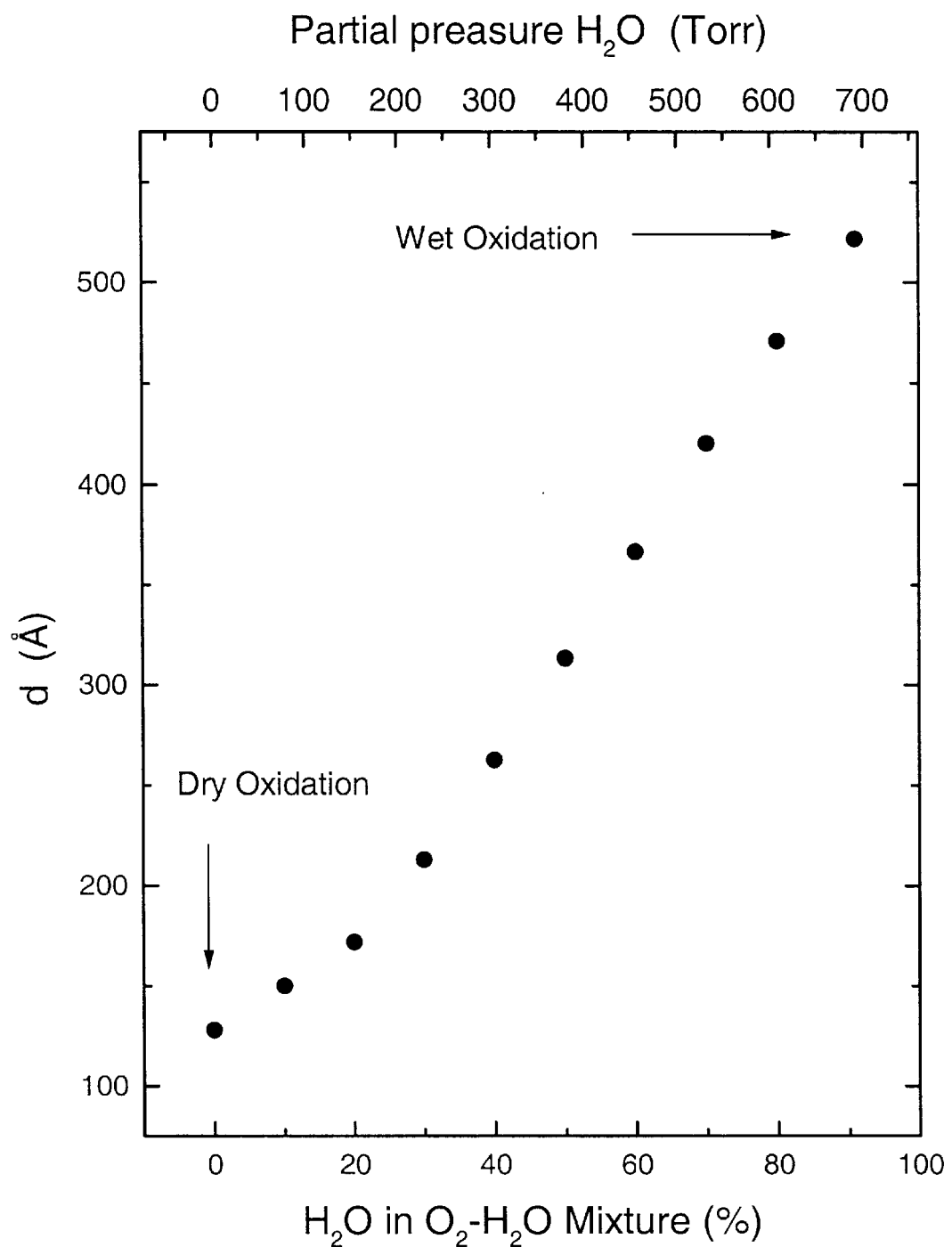
FIG. 2 shows experimental results according to P. C. M ünzinger, W. Lerch, R. Mader and N. Kobayashi, (submitted to Solid State Technol.,) of oxide thickness as a function of the $H_2:O_2$-ratio at 1150° C. for 30 s(1150° C., 30 s) with a constant flow rate of 2 slm in comparison to literature values.

The detailed recipes for wet oxidation use the same basic structure as described by W. Lerch, Phys. Stat. Sol. (a) 158 117–136 (1996). The gas handling differs only slightly compared to dry oxidation recipes. For all these recipes a constant temperature ramp up rate to the desired oxidation temperature of (50° C./s) and ramp down rate of (25° C./s) is used. The gas flow during heating is 2.0 standard liters per minute (slm) with a proportion of 1.82 slm $H_2O$ and 0.18 slm $O_2$, i.e. 91% (692 Torr) steam, leads to the maximum oxide growth during the isochronal and isothermal anneals. The cooling down from the steady state temperature was done in pure nitrogen gas ambient. FIG. 2 shows experimental results of oxide thickness as a function of the $H_2:O_2$-ratio at 1150° C. for 30 s (1150° C., 30 s) with a constant flow rate of 2 slm in comparison to literature values. The wafers were 200 mm diameter,<100>, p-type boron doped, with 6–18 ohm-cm resistivity. The increasing oxide thickness is directly correlated to the saturation of $H_2O$ steam in the process gas and to the partial pressure calculated with Dalton's law. The wet process in our case runs in 91% steam for safety reasons and defines the maximum growth rate.

For the oxide growth experiments described here different types of 125 mm CZ-wafers were used with the parameters summarized in Table 1.

TABLE 1

The parameters of the sample wafers

| Box | Doping | ρ (Ω – cm) | $C_d$ (cm$^{-3}$) | Orientation |
|---|---|---|---|---|
| A | p(B) | 2–6 | 2.0 × 10$^{15}$ | <111> |
| B | p(B) | 1.7–12 | 3.4 × 10$^{15}$ | <100> |
| C | p(B) | 0.01–0.02 | 4.9 × 10$^{18}$ | <100> |
| D | p(B) | 0.005–0.018 | 7.1 × 10$^{18}$ | <111> |
| E | p(B) | 0.003–0.007 | 2.0 × 10$^{19}$ | <100> |
| F | n(P) | >20 | 2.2 × 10$^{14}$ | <111> |
| G | n(P) | 6–9 | 7.1 × 10$^{14}$ | <100> |

The oxidation conditions for the different types of wafers were varied between 825° C. and 1150° C. with a time-split between 0 sec and 300 sec. The 0 second recipes consider the influence of the oxide growth during the ramps. This enables one to separate the oxide growth during steady state from the oxide growth during the whole process. Therefore a comparison to literature data from batch furnace is more reliable.

The oxide thickness d was measured using a PLASMOS ellipsometer SD2300 (refractive index n=1.465) with a measurement accuracy of 1 Å and a repeatability of 0.1 Å. This error is negligible. The calculated errors for the oxide thickness are the standard deviation from the mean of each measurement with 121 points on the wafer as well as the typical repeatability of the AST SHS2800e RTP system of 0.6%. The total error is the sum of the individual errors. An average uniformity of 1.9% for all different time and temperature conditions on the 125 mm wafers was achieved. A further optimization of the uniformity leads only to a smaller error in the measurement.

On 200 mm wafers an optimized oxidation process (1150° C., 30 s; mean oxide thickness 522 Å) led to a uniformity (121 pts) of 1.7%. With a sensitivity of 4 Å/K and a measured oxide range of 35.6 Å an absolute temperature range of 8.9° C. across the wafer can be calculated. The sensitivity of wet oxidation is several times higher than for dry oxidation and varies with the oxide thickness.

Figure 3:
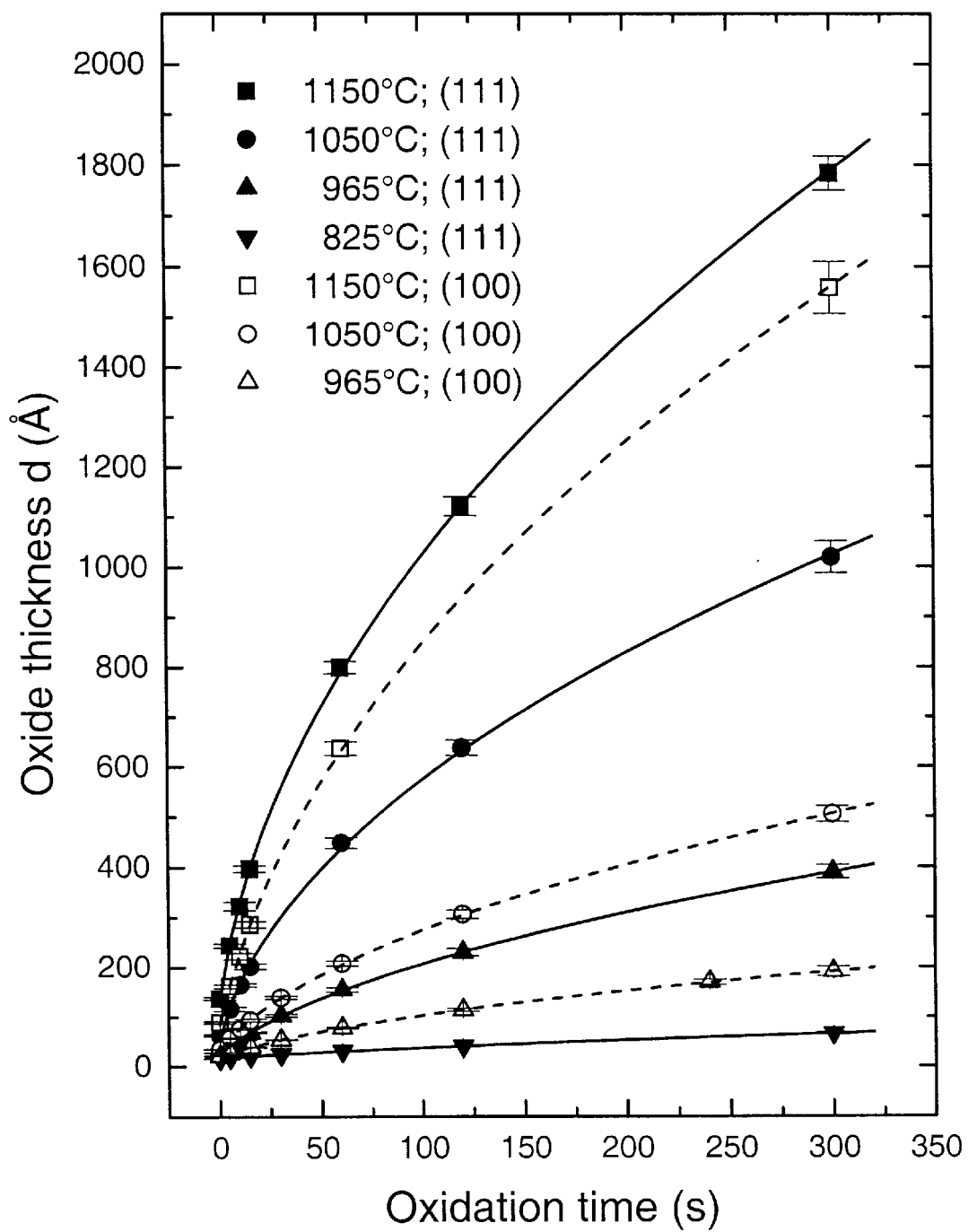
FIG. 3 shows isochronal and isothermal oxidation of silicon in steam (91% $H_2O$, 692 Torr; p(B), (111), 2–6 ohm-cm, closed symbols; p(B), (100), 1.7–12 ohm-cm, open symbols)).

The silicon oxidation is modeled using the linear-parabolic macroscopic formalism of Deal and Grove, cited above. The physical mechanism of the rapid thermal oxidation is almost the same as for conventional furnace oxidation because the incident photons transfer their energy within $10^{-3}$ seconds to a 200 micrometer thick silicon solid via phonons. In the following the characteristic data of the oxidation process are discussed. In FIG. 3 a detailed representative plot of oxide thickness d versus oxidation time t is shown for lightly doped, p(B)-type wafers with <111> and <100> orientation.

In Table 2 the maximum and average oxide thicknesses for different wafer types are summarized. For comparison also some dry rapid thermal oxidation data are added.

TABLE 2

Oxide thicknesses for different wafer species and various thermal budgets

| Box | T (° C.) | t (s) | d (Å) |
|---|---|---|---|
| A | 1150 | 300 | 1784 +/− 34 |
|  | 1150 | 15 | 397 +/− 7 |
|  | 965 | 30 | 103 +/− 3 |
| B | 1150 | 300 | 1558 +/− 51 |
|  | 1150 | 15 | 286 +/− 6 |
|  | 965 | 30 | 54 +/− 1 |
| C | 1150 | 300 | 1705 +/− 43 |
| D | 1150 | 300 | 1781 +/− 34 |
| E | 1150 | 300 | 1691 +/− 54 |
| F | 1150 | 300 | 1613 +/− 36 |
|  | 1150 | 30 | 522 +/− 14 |
|  | 965 | 30 | 85 +/− 3 |
| G | 1150 | 300 | 1332 +/− 37 |
|  | 1150 | 30 | 396 +/− 12 |
|  | 965 | 30 | 55 +/− 1 |
| Dry | 1150 | 30 | 110 |
| Dry | 950 | 30 | 31 |

The solution for d of the differential equation of the oxidant flux related to the oxide growth rate, with the initial boundary condition $d_0$=0 at t=0 leads to the linear parabolic growth rate relationship.

$$d^2 + Ad = B(t+\tau) \quad (1)$$

where $$A = 2D_{eff}\left(\frac{1}{k_s} + \frac{1}{h}\right) \quad (2)$$

$$B = 2D_{eff}\frac{C^*}{N_1}, \quad (3)$$

$$\tau = (d_0^2 + Ad_0)/B \quad (4)$$

with C* as the equilibrium oxidant concentration in the gas ambient, $N_1$ is the number of oxidant molecules incorporated into a unit volume of growing oxide, $k_s$ the chemical surface reaction rate constant for oxidation, h the gas-phase transport coefficient of oxidants and $D_{eff}$ the effective diffusion coefficient of the oxidant in the oxide.

The time dependence of d can be derived from Eq. (1) and two limiting cases can be separated. For large times, the parabolic law is a solution of Eq. (1). The constant B is therefore referred to as the parabolic rate constant. This constant describes the diffusion-limited case of the oxidation (thick oxide case). For short times, t>>$A^2$/4 B, Eq. (1) simplifies to the linear law $$d \cong \frac{B}{A}(t+\tau) \quad (5)$$

The linear rate constant is defined in the following way $$\frac{B}{A} = \frac{k_s h}{k_s + h}\left(\frac{C^*}{N_1}\right) \quad (6)$$

This growth rate depends more on the interface reaction and is limited by the value of $k_s$ and the concentration of oxidants at the interface.

Figure 4:
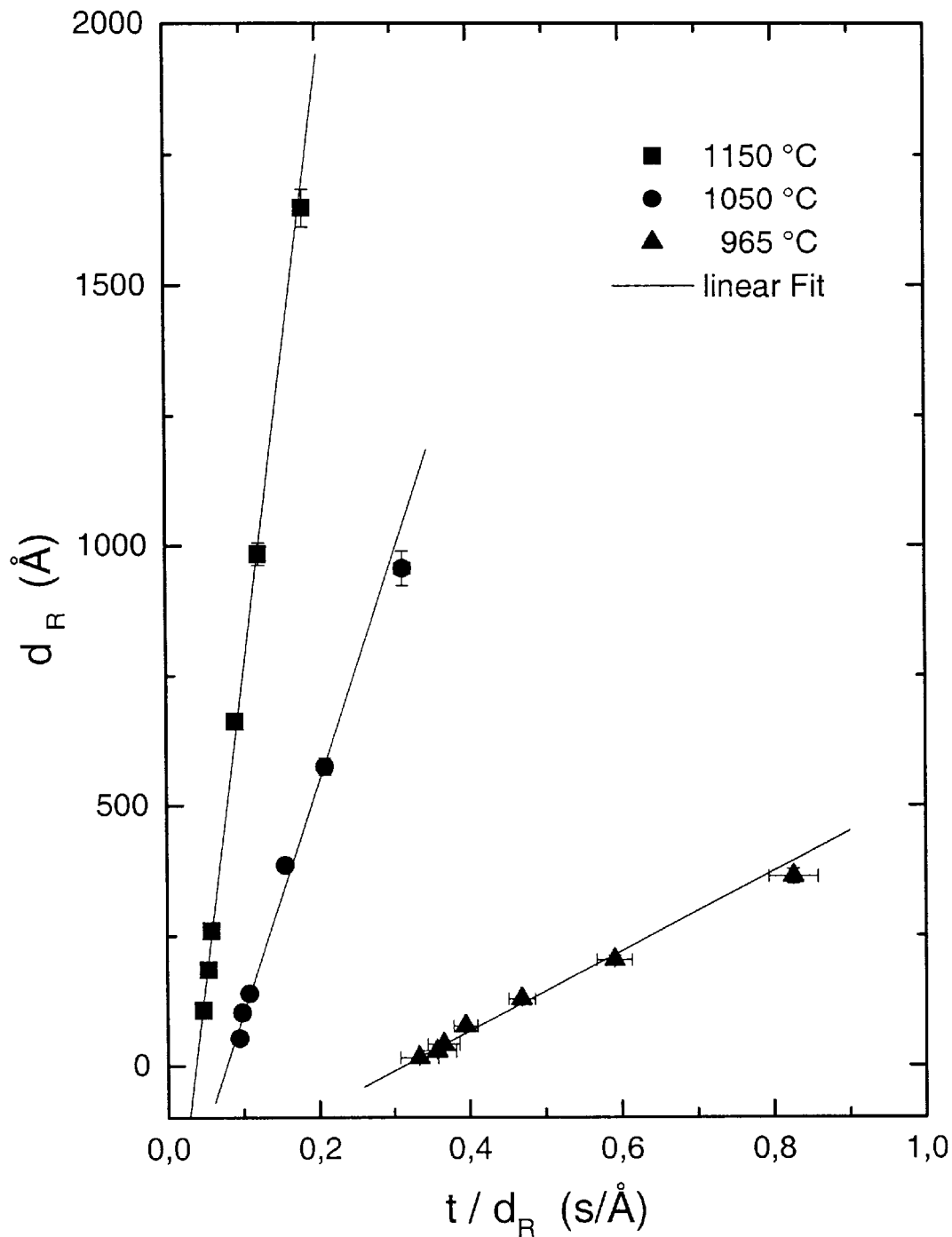
FIG. 4 shows an evaluation of the oxidation constants for p(B), (111), 2–6 ohm-cm silicon.

The evaluation of the numerical values for the constants A, B can be deduced from Eq. (1). The total oxide thickness d, reduced by the resulting ramping oxide thickness $d_0$, versus the quantity $t/(d-d_0)$ yields in a straight line. The intercept is equal to −A and the slope to B(t=0). For simplification the reduced oxide thickness $d_R$ is defined as $d_R$=d−$d_0$. In contrast to Fukuda et al., who studied the dry rapid thermal oxidation in J. Appl. Phys. 31, 3436–3439, (1992), in wet oxidation the measured total oxide thickness grown during ramp up/down must be taken into account compared to the steady state growth (e.g. p(B), (111), 2–6 ohm-cm wafer: 1150° C., 0 s $d_0$=137 Å; 965° C., 0 s $d_0$=27 Å). The wet oxidation data of the (111) oriented wafers from FIG. 3 are plotted this way in FIG. 4.

For all other investigated wafer parameters (orientation, resistivity) and temperatures straight lines are obtained. Absolute values for A and B are determined for the various wafer properties.

Linear and parabolic growth rate constant versus temperature

Figure 5:
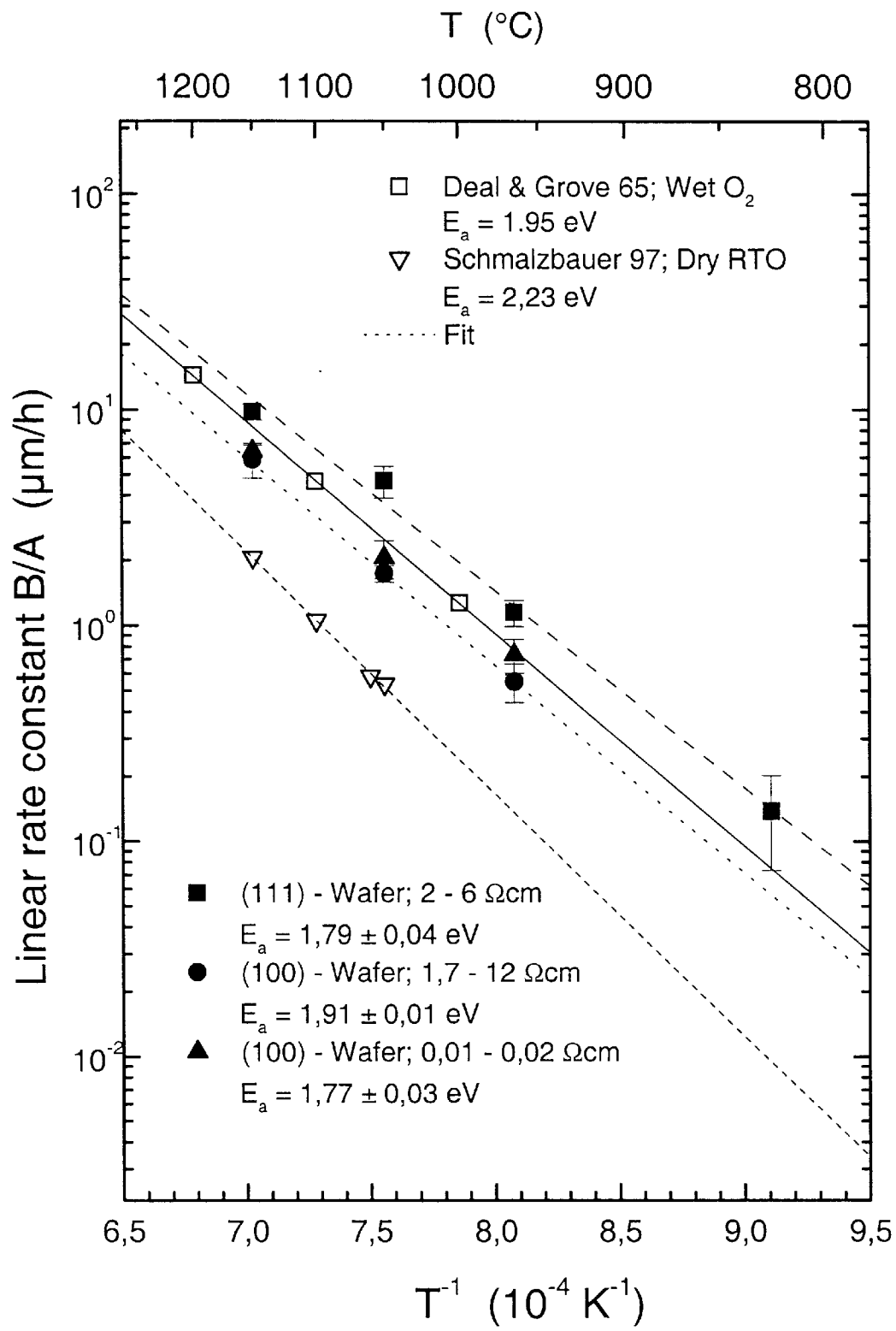
FIG. 5 shows the dependence of the linear rate constant B/A on temperature for wet oxidation on lightly/heavily doped, p(B)-type, (111) and (100) oriented silicon wafers.

In FIG. 5 the linear rate constants for p(B)-type, lightly doped wafers with (111) and (100) orientation are plotted from this work together with the data of Deal and Grove as reference. Additionally data from p-type wafers (100) 0.01–0.02 ohm-cm are added to FIG. 5. The activation energies calculated from this Arrhenius diagram are similar for the (111) oriented wafers, (1.79+/−0.04) eV, and the (100) heavily doped wafers (1.77+/−0.03) eV. These values are in close agreement with the energy required to break Si—Si bonds which is 1.83 eV/molecule. (See, for example, L. Pauling, The Nature of the Chemical Bond, Cornell University Press, New York, 1960, 3rd ed., p. 85). Whereas, Deal and Grove report 1.95 eV (640 Torr $H_2O$) and Fukuda et al. 2.0 eV with dry rapid thermal oxidation. For the lightly doped (100) data the slope is slightly steeper and leads therefore to an activation energy of (2.10+/−0.02) eV. Thus, the oxide growth is slower for the same thermal budget.

Figure 6:
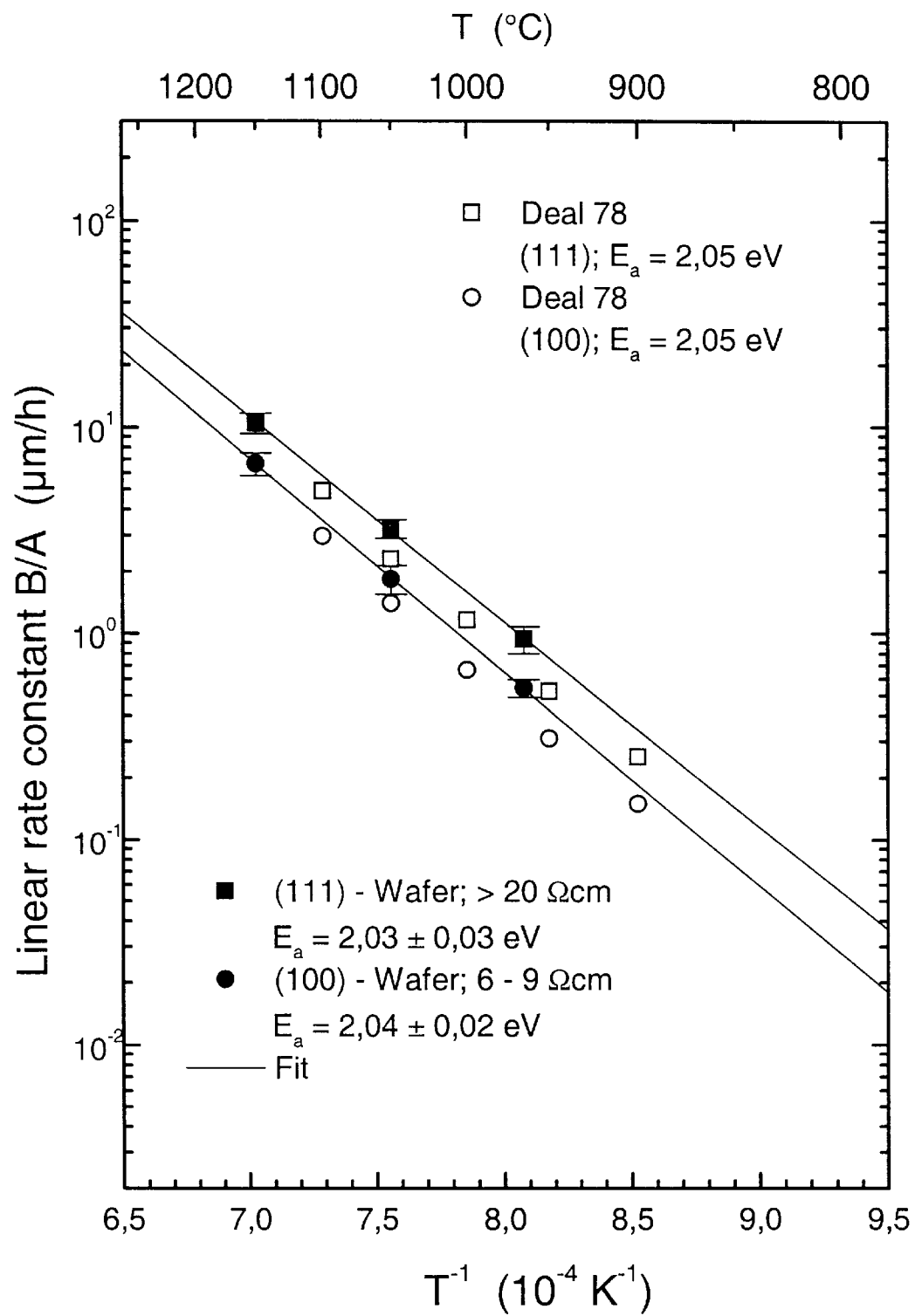
FIG. 6 shows the dependence of the linear rate constant B/A on temperature for wet oxidation on lightly doped, n(P)-type, (100) and (111) oriented silicon wafers.

For the n (Phosphorus doped)-type, lightly doped (111) and (100) oriented wafers similar activation data compared to Deal are found. Our data are displayed together with those of Deal in FIG. 6. The activation energy for the (111) oriented wafers is (2.03+/−0.03) eV and for the (100) oriented ones (2.04+/−0.02) eV. The ratio of B/A between (111) and (100) orientation corresponds favorably well to the data of Deal.

Both Arrhenius plots for p(Boron doped)- and n(P)-type wafers provide reasonable fits between batch furnace data and our RTP system with implemented pyrogenic option.

One useful way obtaining more insight into the physical meaning of the rate constants is to plot oxide thickness as a function of time (deduced from Eq. (1).

$$\frac{d}{A/2} = \left(1 + \frac{t}{A^2/4B}\right)^{\frac{1}{2}} - 1, \qquad (7)$$

Figure 7:
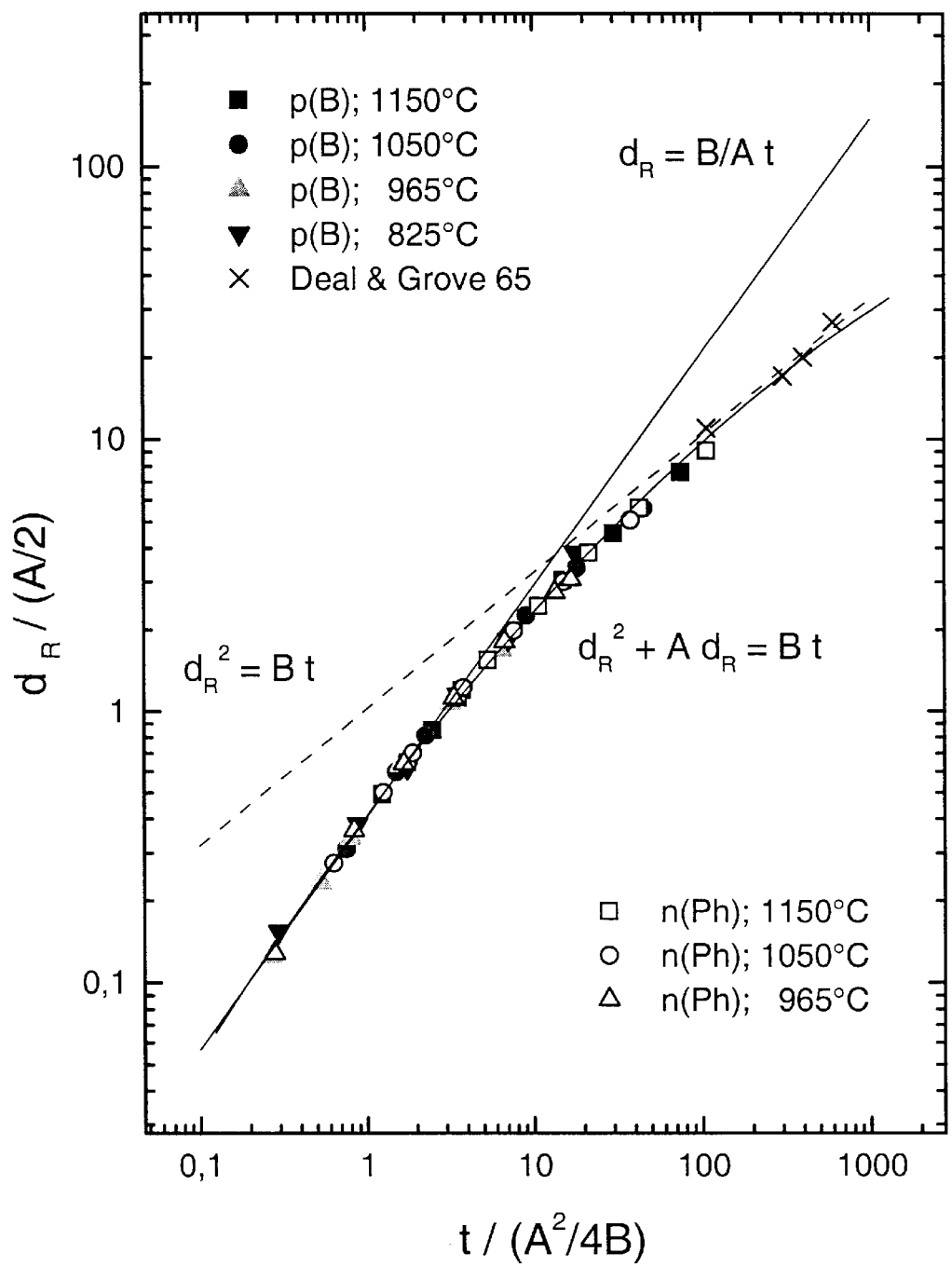
FIG. 7 shows the oxidation rate for oxides grown in steam for (111) oriented wafers at different temperatures, times and also for different substrates. The data of B. E. Deal, S. Grove, J. Appl. Phys. 36 (12) (1965) 3770–3778, are included.

This is of special importance for a rapid thermal oxidation process. The transition from linear to parabolic law is not as well defined as compared to furnace processes with thick oxide layers above 0.5 micrometers. All data obtained can be described by Eq. (7). As an example the (111) oriented, n/p-type data are displayed in FIG. 7. From FIG. 7 it is obvious that most of the data are located in the linear regime. Since the transition from linear to parabolic behavior is not exactly defined, thick oxide data from Deal and Grove were added to FIG. 7. Together with these data one can state that none of the WRTO data follows the parabolic growth law for very long oxidation times.

Figure 8:
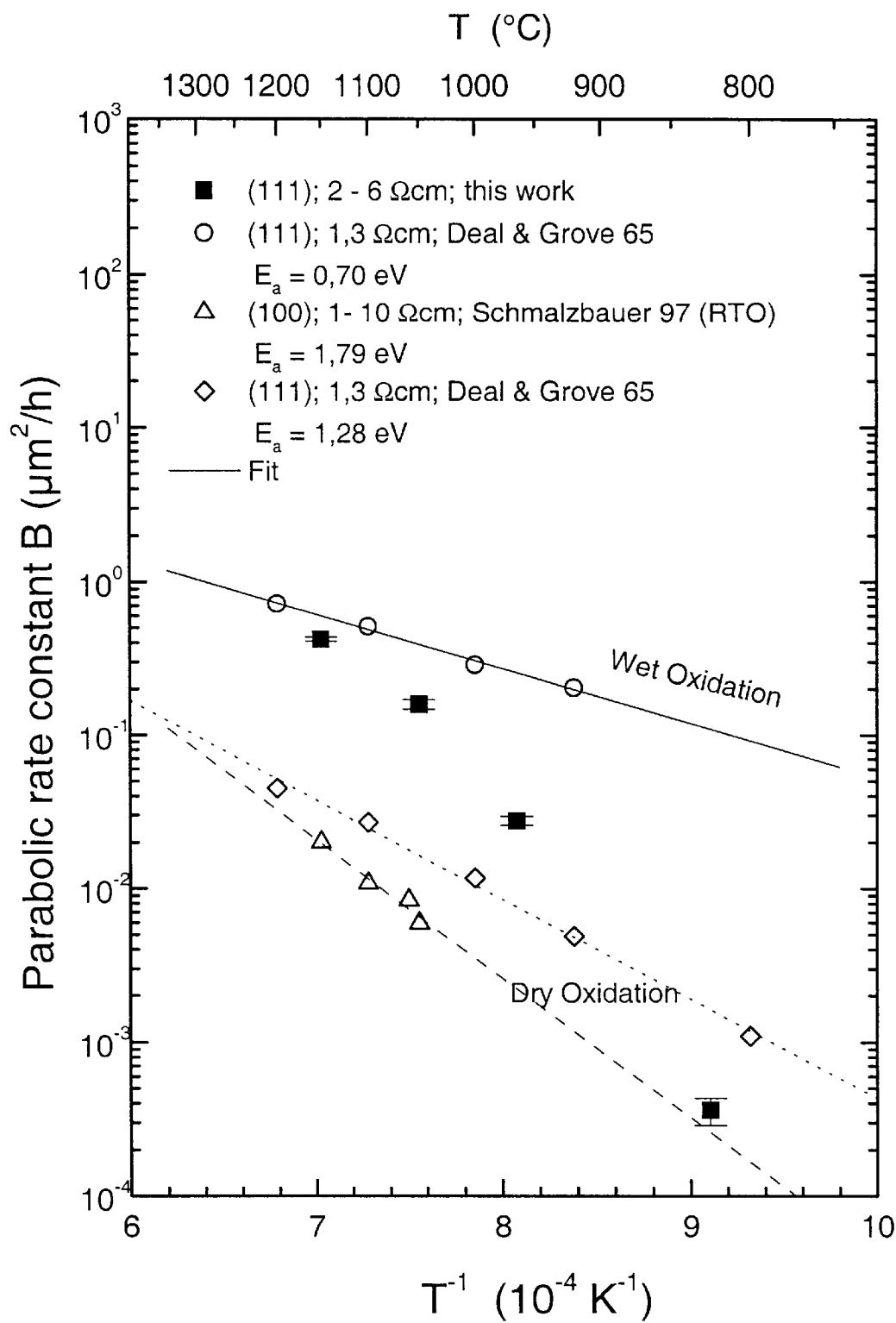
FIG. 8 shows the temperature dependence of the parabolic rate constant B for (111) oriented p(B)-type wafers (Box A, Table 1).

The temperature dependence of the parabolic rate constant versus temperature is displayed in FIG. 8. The p(B)-type data ((111), Box A) are displayed as an example, all the other substrates show a similar dependence. Usually, the rate constant is independent of substrate doping and oxidation process itself because the limiting condition is the diffusivity of the oxidant. As FIG. 8 displays, the steam oxidation time in the RTP system does not lead to a parabolic growth especially for the data at 825° C. (see FIG. 7). The activation energy of Deal and Grove is 0.70 eV. Compared to their maximum oxidation time of 10 hours the WRTO times are 120 times shorter. In our case the reaction limited oxidation at the interface is separated from the diffusion limited oxidation. Even the dry RTO data from Fukuda et al. (1.74 eV) result in larger activation energies for the parabolic growth rate constant than Deal and Grove (1.23 eV).

The linear growth rate constant versus doping concentration.

Figure 9:
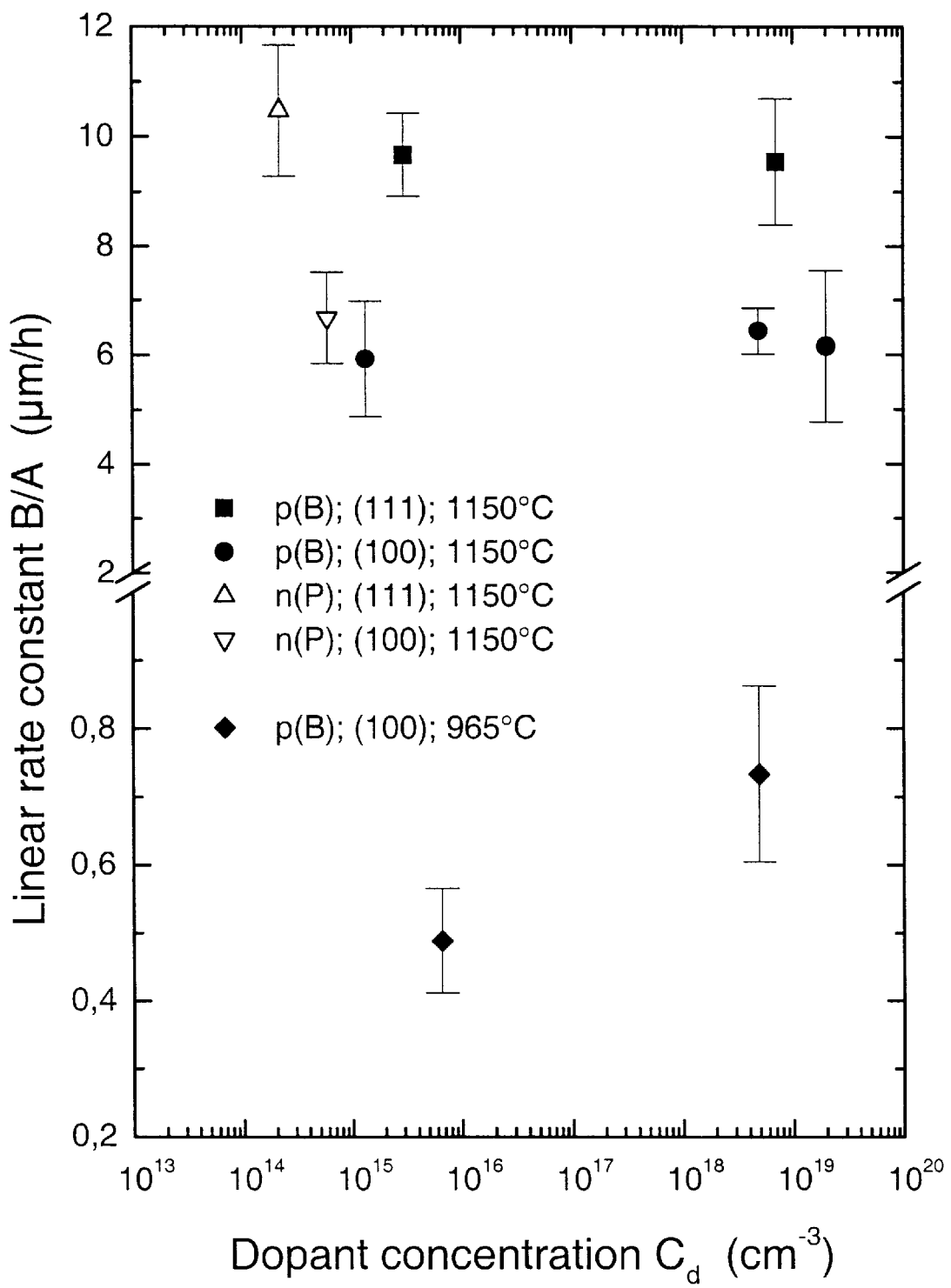
FIG. 9 shows the dependence of the linear rate constant on the initial doping concentration at 965° C. and 115° C.

Most data presented for the oxidation kinetics in literature are only valid for lightly doped silicon substrates (resistivity greater than 1 ohm-cm) which are intrinsic at oxidation temperature. For heavily doped substrates a Doping-Enhanced Oxidation (DEO) effect is observed, as reported by P. Balk. The Si—SiO2 System, Elsevier, Amsterdam, 1988. In FIG. 9 the linear rate constant on doping concentration is displayed for 1150° C. Within the error bars no significant DEO effect is visible. At 1150° C. the influence of the temperature on the oxide growth is higher than the bulk doping concentration whereas at 965° C. the effect is vice versa (FIG. 9). Balk states a linear increase of the B/A-value at 900° C. (dry oxidation) and phosphorus dopant concentrations higher than $4 \times 10^{19}$ cm$^{-3}$. The DEO effect is mainly caused by an increase of the linear growth rate with increasing doping concentration, whereas the parabolic growth rate stays constant over the concentration interval. Balk reports a stronger, more obvious behavior for much higher doping concentrations (>$10^{20}$ cm$^{-3}$).

Electrical Breakdown Characteristics

The chemistry of wet oxidation at the silicon—silicon dioxide interface is not yet fully understood. (R. B. Fair, "Diffusion and oxidation of silicon" in MICROELECTRONICS PROCESSING: CHEMICAL ENGINEERING ASPECTS, Eds. Dennis W. Hess and Klavs F. Jensen, American Chemical Society, Washington, 1989, pp. 265–323). The electron acceptor attribute of SiOH and the electron donor behavior of SiH is accepted. Therefore proper control of oxidation and annealing conditions with respect to hydrogen (water) is a crucial step in the technology for a high quality oxide with good electrical breakdown characteristics. The influence of hydrogen in $SiO_2$ films on silicon is described by Revesz in J. Electrochem. Soc. 126 122–130, (1979).

For more uniform oxides with few defects Deal used a small addition of HCl for protection from metal contamination during batch furnace processing. Our RTP results indicate that the technology of additional HCl or TCA is not necessary. The preliminary excellent electrical breakdown results demonstrate this impressively. A pure dry oxidization for 240 sec at 1050° C. gives 118 Å oxide thickness with a defect density (DD) (<0.1 coulomb/cm$^2$ for 1 cm$^2$ capacitors) of 0.51 and a yield of 99%. A pure wet oxidization for 30 sec at 1050° C. gives DD=0.51 with a yield of 97%. For our experiments we used a 1050° C., 30 s wet oxidation process with 91% $H_2O$ composition and a Post Oxidation Anneal (POA). The POA drives the hydrogen remaining in the film out, decreases DD, and increases yield. The thermal budget for all POA was 1100° C. 30 s. Variations of the gas ambient during the POA lead to slight differences in the yield (POA(GOI I): 100% O2, POA(GOI II): 90% N2 and 10% O2; POA(GOI III), POA(GOI IV): 100% N2). These experiments are performed with 125 mm n(As)-type epi-wafers (epi-layer resistance 0.25 ohm-cm, substrate resistivity <5 milliohm-cm).

It is vital to adequately flush the RTP chamber with a dry gas between the oxidization step and the POA. When we tried to flush the chamber for just 10 sec at 750° C., the yield for wet oxide plus POA in 100% $O_2$ dropped from 100% to 86%. We suppose that the flushing step is necessary to remove hydrogen adsorbed in the walls of the chamber. Otherwise, when we try to drive the hydrogen in the oxide film out, we can not adequately remove it because the chamber walls act as a source of hydrogen. For all the experiments cited below, the chamber temperature ramped down from the wet oxidization temperature to 750° C., and the chamber was flushed for 130 sec. The temperature was then ramped back up to 1100° C. for the POA. The partial pressure of hydrogen in the chamber in the POA is preferably less than 1000 ppm, more preferably less than 100 ppm, and most preferably less than 10 ppm. We were limited in the flow rate of dry oxygen or nitrogen available to flush the chamber. 130 seconds was sufficient time to change the gas in the chamber four times. However, it is not clear that more dry gas flow would cut the flushing time down substantially, as the time required to reduce the hydrogen pressure in the POA step may be related to the time required to drive the absorbed hydrogen from the chamber walls, and not have much to do with the absolute value of the hydrogen concentration, as long as the concentration is below some maximum value which must be determined by further experiment. The performance of this experiment is clear to one skilled in the art as taught by the present specification. The correct time-temperature for the minimum flushing time may be found by experimentation which will be obvious to one of ordinary skill in the art.

TABLE 3

Summary of the oxide thicknesses, yield and defect data for the electrical breakdown experiments

| Wafer | Process | d (Å) | DD <0.10 C./ cm² (cm⁻²) | Yield <0.10 C./ cm² (%) |
|---|---|---|---|---|
| GOI I | 1050° C. 30s + POA (GOI I) | 171 +/- 4 | 0.0 | 100 |
| GOI II | 1050° C. 30s + POA (GOI II) | 147 +/- 3 | 0.13 | 99 |
| GOI III | 1050° C. 30s + POA (GOI III) | 146 +/- 3 | 0.25 | 98 |
| GOI IV | 1050° C. 30s + POA (GOI IV) | 145 +/- 3 | 0.25 | 98 |

Figure 10:
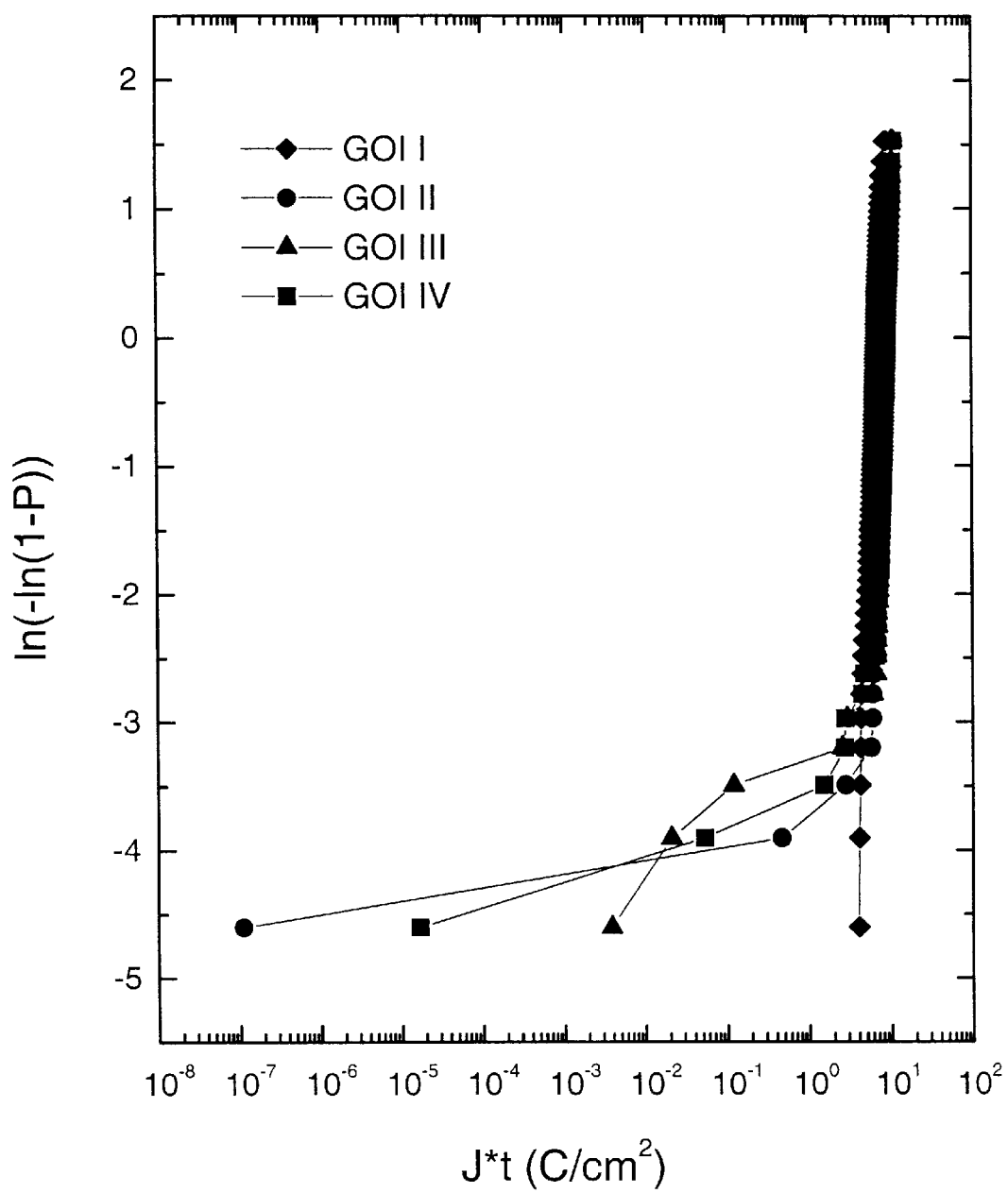
FIG. 10 shows the breakdown characteristics of RTP grown oxides on n(As)-type substrate.

The dielectric properties of the RTP grown oxides have been investigated with a current ramp GOI (Gate Oxide Integrity) experiment. Breakdown characteristics of the capacitors on several wafers are shown on a probability plot in FIG. 10. Two different failure modes can be identified in this graphic representation, as shown by W. Bergholz, Mat. Sci. Eng. B4, 359–366, (1989). The steep increase of breakdowns around the charge density of 5–10° C./cm$^{-2}$ is typical for the intrinsic dielectric $SiO_2$ breakage in the material used here. Only a few wearout breakdowns which are indications for weak spots in the oxide can be found prior to this intrinsic breakage. The defect density resulting from the pre-breakdowns was calculated and is below 0.25 cm$^{-2}$. Thermal oxides on epitaxial wafers used in this study, are known to have the potential of very high gate oxide quality due to the low defect density in the silicon which is consumed during the oxidation. The results shown in FIG. 10 are comparable to the gate oxide quality achieved in batch furnace tubes. Since epitaxial wafers provide the highest crystal perfection and therefore the most sensitive test with respect to process induced defects we conclude that our RTP steam oxidation process is capable of generating state of the art high quality oxides.

Rapid Thermal Chemical Vapor Deposition (RT-CVD) of SiO2, silicon and other films on silicon or other substrates typically uses the breakdown of hydrogen or halogen containing gases to produce the required films. It is clear that the hydrogen or halogen produced in the chamber or left in the film will also change the film characteristics. Thus, a post anneal (PA) in a different gas than that used for the CVD reaction will also be necessary. In this case, a flushing step with correctly chosen parameters will also be useful for better material quality.

Figure 11:
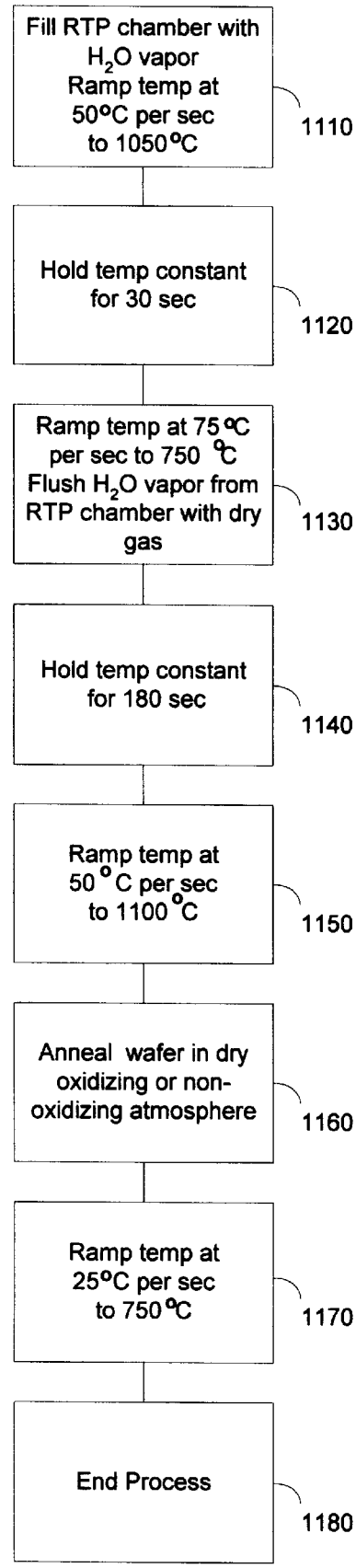
FIG. 11 shows a flow chart of the method of the invention.

FIG. 11 is a flow chart of the method of the invention. The ramp rates shown are preferred, but may be lower without harm to the wafers. The ramp rates may be faster as the uniformity of illumination or the uniformity of the wafers is increased. Step 1110 shows the temperature of the wafer ramped up to oxidization temperature in an atmosphere of water vapor. The temperature may alternatively be ramped up and then the water vapor introduced. Step 1120 is the wet oxidization step of 1050° C. for 30 sec. Step 1130 ramps the temperature down to the flushing temperature, in this case 750° C., and step 1140 shows flushing the system for 130 sec. Alternative times and temperatures as found by experiment may alternatively be used in this step. In step 1150, the temperature is raised to 1100° C., and in step 1160 the wafer has a POA for 30 sec in an atmosphere which does not contain hydrogen. In step 1170, the temperature is ramped down to 750° C., and the process is ended in step 1180.

A number of processes will be clear to one skilled in the art. Among them are processes where one active gas is used in the chamber to deposit or to grow a film on the surface of a semiconductor wafer heated in an RTP system, and a different gas used to drive an active component of the first gas from the resulting material by heating the wafer in a second gas atmosphere. A more preferred embodiment is to ensure that the film or the second gas atmosphere is not contaminated by a component of the first gas by adequate flushing of the chamber between the first and second gas treatments. The time and temperature of the flushing step may be found by experiment for each treatment by following the procedures outlined above.

The above identified U.S. patents and patent applications, and the references cited above, are hereby include herein by reference.

We claim:

1. A method of producing a film on a surface of a semiconductor wafer in an rapid thermal processing (RTP) system, comprising:

a) rapidly raising the temperature of said wafer to a first temperature $T_1$;

b) holding the temperature of said wafer approximately constant at $T_1$ for a period of time in a range of seconds or minutes for processing said wafer in an atmosphere containing a substantial vapor pressure of a first reactive gas;

c) reducing the temperature of said wafer to a third temperature $T_3$, where $T_3$ substantially less than $T_1$;

d) flushing said RTP system with a gas substantially free of the first reactive gas, keeping the wafer temperature approximately constant for a period of time in a range of seconds to minutes;

e) rapidly rising the wafer temperature from $T_3$ to a second temperature $T_2$; and f) holding the wafer temperature approximately constant at $T_2$ for a period of time in a range of seconds or minutes, while rapidly processing said wafer at $T_2$ in an atmosphere different from said first reactive gas.

2. The method according to claim 1, characterized in that said second atmosphere is substantially free of said first reactive gas.

3. The method according to claim 1, characterized in that said second atmosphere comprises oxygen.

4. The method of claim 1, characterized in that said first reactive gas is free of HCl and trichloroethane (TCA).

5. The method of claim 1, characterized in that said second temperature is in the range of 1100° C. for about 30 seconds, reducing thermal budget to said wafer.

6. The method of claim 1, characterized in that said flushing gas is dry oxygen.

7. The method of claim 1, characterized in that said flushing gas is dry nitrogen.

8. The method of claim 1, characterized in that said third temperature is in the range of 750° C. and the system is flushed for about 130 seconds.

9. The method of claim 1, characterized in that said first temperature is in the range of 1050° C. for about 30 seconds.

10. The method of claim 1, characterized in that said film on that surface of said wafer is made by oxidation.

11. The method of claim 10, characterized in that said first reactive gas comprises water vapor.

12. The method of claim 1, characterized in that said first reactive gas comprises oxygen.

13. The method of claim 11, characterized in that said atmosphere at said second temperature is substantially free of water vapor.

* * * * *